(12) United States Patent
Ikeguchi et al.

(10) Patent No.: US 6,528,552 B1
(45) Date of Patent: Mar. 4, 2003

(54) RESIST COMPOSITION EXCELLENT IN FLAME RESISTANCE

(75) Inventors: Nobuyuki Ikeguchi, Tokyo (JP); Takabumi Omori, Tokyo (JP); Kenji Ishii, Tokyo (JP); Toru Harada, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 09/987,133

(22) Filed: Nov. 13, 2001

(30) Foreign Application Priority Data

Nov. 14, 2000 (JP) ........................................ 2000-346681

(51) Int. Cl.$^7$ ........................ C09D 163/00; C08L 63/00; C08K 3/10
(52) U.S. Cl. .......................... 522/81; 522/100; 522/102; 522/103; 524/406; 524/437; 524/784; 524/786; 523/442; 523/458; 523/459
(58) Field of Search .......................... 522/81, 100, 102, 522/103; 524/406, 437, 784, 786; 523/442, 458, 459

(56) References Cited

U.S. PATENT DOCUMENTS 5,009,982 A * 4/1991 Kamayachi
6,361,866 B1 * 3/2002 Ogima

FOREIGN PATENT DOCUMENTS

GB  2306167  * 4/1997

* cited by examiner

*Primary Examiner*—David J. Buttner
(74) *Attorney, Agent, or Firm*—Wenderoth, Lind & Ponack, L.L.P.

(57) ABSTRACT

A resist composition for permanent protective coating of a printed wiring board, which resist composition is excellent in flame resistance and is obtained by incorporating as essential components a flame retardant containing 100 to 140 parts by weight of (a) aluminum hydroxide, 0.1 to 15 parts by weight of (b) a molybdenum compound and 0.1 to 10 parts by weight of (c) a zinc stannate type compound into 100 parts by weight of a resin.

8 Claims, No Drawings

RESIST COMPOSITION EXCELLENT IN FLAME RESISTANCE

FIELD OF THE INVENTION

The present invention relates to a resist composition excellent in flame resistance for permanent protective coating of a printed wiring board. More specifically, it relates to a resist composition for permanent protective coating of a printed wiring board which resist composition contains almost no halogen, almost no phosphorus and almost no antimony and is excellent in flame resistance. A printed wiring board obtained by applying the resist composition of the present invention, drying the applied resist composition and curing the dried resist composition is suited mainly for use in a semiconductor plastic package as a high-density and small-sized printed wiring board. The resist composition of the present invention is applied on a printed wiring board surface having copper circuits formed, a solvent is removed from the applied composition by heating as required, and then the resist composition is thermally-cured or photically-cured. Otherwise, the resist composition is selectively photically-cured, not-cured portions are developed and removed, and the resist composition is thermally post-cured. The thus-obtained coating is used as a permanent protective coating for a printed wiring board.

RELATED ARTS OF THE INVENTION

Conventionally, a thermosetting type resist, a photo-setting type resist and a photo-setting/thermosetting type resist used as a permanent protective coating for a printed wiring board are a resin composition having no self-extinguishing properties in itself. The above resin composition is applied to the surface of a laminate containing a bromine compound and the applied resin composition is dried and then cured. When the laminate fires, the bromine compound contained in the laminate burns and decomposes to generate a bromine gas and the bromine gas prevents the permanent protective coating as the external layer from burning. In this case, as a result, the laminate as a whole can attain V-0 (self-extinguishing properties) in the UL 94 standard. However, when the above resin composition having no self-extinguishing properties is applied to a halogen-free, phosphorus-free and antimony-free laminate containing no bromine, dried and then cured, the resultant laminate naturally has an inflammable permanent protective coating as an external layer. In this case, since water and a gas which generate when the laminate burns do not prevent so much the permanent protective coating as an external layer from burning, the laminate as a whole shows inflammability. Further, attempts have been made to impart flame retardancy to a permanent protective coating itself as an external layer. As a method for improving the flame resistance of a laminate as a whole by increasing the flame resistance of a flame-retardant permanent protective coating itself, it is necessarily required to incorporate halogen, phosphorus, antimony, etc., into a coating agent for the above permanent protective coating. However, the coating agent containing halogen, phosphorus, antimony, etc., has problems. Therefore, developments of a coating agent which does not contain the above compounds are expected. For this reason, there has not been produced a printed wiring board comprising a halogen-free, phosphorus-free and antimony-free permanent protective coating having self-extinguishing properties (UL flame resistance V-0).

Further, a resist generally contains a color pigment. In most cases, the color pigment is green. The green pigment is generally phthalocyanine green. The molecule of the phthalocyanine green has chlorine in a large amount. Therefore, the phthalocyanine green has a problem in view of the generation of dioxin.

For imparting flame resistance and for avoiding decreasing the characteristic properties of a resist, a phosphoric compound is added in some cases. However, in order to obtain flame resistance, it is required to add a phosphoric compound in an amount of 1 to 5% by weight. Further, some additives generate a toxic substance such as phosphine during burning. Many of the resists containing a phosphoric compound have problems. Further, antimony is not preferred in view of toxicity.

As a resin for a liquid photo-setting/thermosetting coating composition which is developed with an aqueous solution containing an organic solvent or a dilute alkaline aqueous solution, there are known a resin composition (JP-A-1-139619) prepared by incorporating an aromatic epoxy compound into an unsaturated resin obtained by reacting a carboxyl-group-containing acrylate resin with a glycidyl (meth) acrylate, a resin composition (JP-A-61-243869) prepared by adding a diluent into a compound obtained by reacting a saturated or unsaturated polybasic acid anhydride with a reaction product of a novolak type epoxy resin and an unsaturated carboxylic acid, and a resin composition (JP-A-8-41150) prepared incorporating a cresol novolak type epoxy resin into a resin obtained by reacting an alicyclic epoxy-group-containing (meth)acrylate with some of carboxyl groups of a vinyl copolymer having as essential components a (meth)acrylic acid and a lactone-modified hydroxyl (meth)acrylate.

However, a resist containing the above resin composition is not a resist which itself has self-extinguishing properties (flame resistance V-0) so that imparting flame resistance has been required. In recent years, a printed wiring board is becoming denser and denser. An external-layer permanent protective coating on a high-density printed wiring board has insufficient heat resistance and anti-migration properties. Therefore, conventional resists have problems from the viewpoint of reliability also.

SUMMARY OF THE INVENTION

It is an object of the present invention to provide a resist composition for a permanent protective coating of a printed wiring board which resist composition itself has self-extinguishing properties and is excellent in flame resistance.

It is another object of the present invention to provide a halogen-free, phosphorus-free and antimony-free resist composition for a permanent protective coating of a printed wiring board which resist composition has self-extinguishing properties and is excellent in flame resistance.

It is further another object of the present invention to provide a resist composition for a permanent protective coating of a printed wiring board which resist composition is excellent in reliability such as anti-migration properties.

According to the present invention, there is provided a resist composition for permanent protective coating of a printed wiring board, which resist composition is excellent in flame resistance and is obtained by incorporating as essential components a flame retardant containing 100 to 140 parts by weight of (a) aluminum hydroxide, 0.1 to 15 parts by weight of (b) amolybdenum compound and 0.1 to 10 parts by weight of (c) a zinc stannate type compound into 100 parts by weight of a resin.

According to the present invention, further, there is provided a resist composition according to above, wherein the resin is at least one selected from the group consisting of a thermosetting resin, a photo-setting/thermosetting resin and a photo-setting resin.

According to the present invention, further, there is provided a resist composition according to above, wherein the photo-setting/thermosetting resin is a resin containing 5 to 35% by weight of (d) an epoxy resin, 20 to 90% by weight of (e) an unsaturated-group-containing polycarboxylic acid resin, 1 to 30% by weight of (f) ethylenic unsaturated monomer and 0.1 to 20% by weight of (g) a photopolymerization initiator as essential components.

According to the present invention, further, there is provided a resist composition according to above, wherein the unsaturated-group-containing polycarboxylic acid resin is a resin having an acid value of 40 to 200 mgKOH/g and obtained by reacting a reaction product of 100 parts by weight of epoxy acrylate and 5 to 40 parts by weight of a polyfunctional cyanate ester compound, with 10 to 90 parts by weight of a polybasic acid anhydride.

DETAILED EXPLANATION OF THE INVENTION

The resist for a permanent protective coating in the present invention includes a generally known resist. That is, there may be used any one of a thermosetting type resist, a photo-setting/thermosetting type resist and a photo-setting type resist. However, a resist containing a polyfunctional cyanate ester compound or a resist containing a resin having a molecule in which a polyfunctional cyanate ester compound is incorporated by reaction is preferably used in view of heat resistance and anti-migration properties.

The polyfunctional cyanate ester compound used in the present invention refers to a compound having a molecule containing at least 2 cyanato groups. Specific examples thereof include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis (4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris (4-cyanatophenyl)phosphite, tris(4-cyanatophenyl) phosphate and cyanates obtained by a reaction of novolak with cyan halide.

In addition to the above ester compounds, there may be used polyfunctional cyanate ester compounds described in Japanese Patent Publications Nos. 41-1928, 43-18468, 44-4791, 45-11712, 46-41112 and 47-26853 and JP-A-51-63149. Further, there may be also used prepolymers having a molecular weight of 400 to 6,000 and having a triazine ring formed by the trimerizing cyanato group of each of these polyfunctional cyanate ester compounds. The above prepolymer is obtained by polymerizing the above polyfunctional cyanate ester monomer in the presence of an acid such as a mineral acid or a Lewis acid; a base such as tertiary amine, e.g., sodium alcoholate, or a salt such as sodium carbonate as a catalyst. The prepolymer partially contains an unreacted monomer and is in the form of a mixture of monomer with prepolymer, and this material is preferably used in the present invention. When used, generally, the above resin is dissolved in an organic solvent in which it is soluble.

Most of resins used as a thermosetting component is an epoxy resin. This epoxy resin component (d) may be selected from generally known epoxy resins. Specifically, it includes a liquid or solid bisphenol A type epoxy resin, a bisphenol F type epoxy resin, a phenol novolak type epoxy resin, a cresol novolak type epoxy resin, an alicyclic epoxy resin; polyepoxy compounds obtained by epoxidizing the double bond of butadiene, pentadiene, vinylcyclohexene or dicyclopentyl ether; and polyglycidyl compounds obtained by reacting a polyol, a hydroxyl-group-containing silicon resin and epohalohydrin. These resins may be used alone or in combination. The epoxy resin inevitably contains chlorine. On the other hand, for the above purpose, it is preferred that the amount of chlorine is as small as possible. However, a limitation exists in view of a cost. According to the halogen-free copper-clad laminate test method, Japan Printed Circuit Association (JPCA) standard, JPCA-ES-01-1999, the amount of each of chlorine and bromine is respectively 0.09% or lower in the definition of a halogen-free material. This value is a reference as a limit value.

When the resist composition containing anyone of the above epoxy resins is thermally cured at approximately 150° C. for approximately 1 hour, an unreacted epoxy resin remains. Accordingly, the above resist composition is poor in its adhesion to copper of a copper-circuits-possessing printed wiring board. For this reason, a potential curing agent-curing accelerator is used in order to cure the unreacted epoxy resin. The potential curing agent-curing accelerator is not specially limited. For improving a preservation stability a potential curing agent-curing accelerator having a melting point of at least 100° C. and further having a solubility of 10% by weight in the resist composition (a solvent is included) is preferably used. The potential curing agent-curing accelerator is a curing agent which is reacted with the epoxy resin by melting, decomposition, elution, an ionic reaction or a protect cover dissolution by heating it up to at least 100° C. and accelerates the curing of the epoxy resin. The potential curing agent curing accelerator has a small activity at a temperature lower than the melting point. The resin composition containing the potential curing agent-curing accelerator is excellent in preservation stability.

The potential curing agent-curing accelerator which is melted by heating and reacted is not specially limited. Dicyandiamide, an organic acid hydrazide, diaminomaleonitrile, melamine, derivatives of melamine, polyamine salt, and etc., can be used, while an adduct type curing agent is preferred. An amine-adduct type curing agent is further preferred. The amine-adduct type curing agent is a prepolymer type curing agent having an active hydrogen site and a catalyst-function site in a molecule and it is an adduct of an amine compound with an epoxy resin and has a melting point of at least 100° C. Further, known potential curing agent-curing accelerator can be used. These potential curing agent-curing accelerator are dispersed as a powder, preferably a powder having a particle diameter of 5 μm or less, in the resin composition. These potential curing agent-curing accelerator can be used alone or in combination. The amount of thereof is 0.1 to 10% by weight, preferably 0.2 to 8% by weight.

A heat-curing catalyst can be added in the above resist composition for further promoting curing. Although the heat-curing catalyst is not specially limited, an epoxy heat-curing catalyst having a melting point of at least 100° C. and, more preferably, having a solubility of 10% by weight in the resist composition is added in an amount of 0.01 to 10% by weight, preferably 0.1 to 5% by weight, for maintaining a fine preservation stability. The heat-curing catalyst is uniformly dispersed as a fine powder. The imidazole type heat-curing catalyst includes 2-heptadecylimidazole, 2-phenyl-4,5-dihydroxymethylimidazole, 2-phenyl-4-methyl-5-5 hydroxymethylimidazole, 2-phenyl-4-benzyl-5- hydroxymethylimidazole and 2,4-diamino-6-{2-methylimidazolyl-(1)}-ethyl-S-triazine. The imidazole type heat-curing catalyst is limited to these. These heat-curing catalyst can be used alone or in combination.

As for the photo-setting/thermosetting type resist, the photo-setting/thermosetting resin is applied to a printed wiring board surface and then dried by heating to remove a solvent, then a photo-setting component is selectively cured by irradiation of light, an not-cured component which has not been exposed to the light is dissolved and removed with an alkaline developer, and then a thermosetting component is thermally cured by heating to give a permanent protective coating. Especially, the coating obtained from the photo-setting/thermosetting type resist containing a resin having a molecule in which a polyfunctional cyanate ester compound is incorporated by reaction, provided by the present invention, is excellent in heat resistance and there can be obtained a printed wiring board which is excellent in anti-migration properties and excellent in heat resistance as a whole.

The unsaturated-group-containing polycarboxylic acid resin as component (e) used in the photo-setting/thermosetting type resist of the present invention refers to a resin having a molecule containing a carboxyl group and an unsaturated group such as a (meth)acryloyl group. The unsaturated-group-containing polycarboxylic acid resin is selected from generally known unsaturated-group-containing polycarboxylic acid resins. Examples thereof includes generally known unsaturated-group-containing polycarboxylic acid resins such as an unsaturated-group-containing resin shown in JP-A-1-139619 and obtained by reacting a carboxyl-group-containing acrylate resin with a glycidyl (meth) acrylate, an unsaturated-group-containing resin shown in JP-A-8-41150 and obtained by reacting an alicyclic epoxy-group-containing unsaturated compound with some of carboxyl groups of a vinyl copolymer having as essential components a (meth)acrylic acid and a lactone-modified hydroxyalkyl (meth)acrylate, and a resin shown in JP-A-61-243869 and obtained by reacting a saturated or unsaturated polybasic acid anhydride with a reaction product of a novolac type epoxy resin and an unsaturated monocarboxylic acid.

Among the unsaturated-group-containing polycarboxylic acid resins as component (e) used in the present invention, preferred are an unsaturated-group-containing resin obtained by reacting an alicyclic epoxy-group-containing unsaturated compound with a carboxyl-group-containing (meth) acylate resin having as essential components a (meth) acrylic acid having an acid value of 10 to 200 mgKOH/g, a double bond of 1.0 to 3.5 mol per 1 kg of a resin and a number average molecular weight of 1,000 to 50,000 and a lactone-modified hydroxyalkyl (meth) acrylate; and an unsaturated-group-containing polycarboxylic acid resin having an acid value of 40 to 160 mgKOH/g and obtained by reacting a phenol novolak type epoxy resin, a cresol novolak type epoxy resin and an unsaturated carboxylic acid in an acid equivalent/epoxy equivalent ratio of from 0.2 to 1.0 to prepare a reaction product and then reacting a hydroxyl group of the reaction product with a saturated or unsaturated polybasic acid anhydride in an acid equivalent/hydroxyl group equivalent ratio of 0.2 or higher.

However, as a permanent protective coating for a high-density printed wiring board, heat resistance and anti-migration properties become problems. Therefore, there is more preferably used an unsaturated-group-containing poly-carboxylic resin (e) whose molecule contains a polyfunctional cyanate ester compound. A preferred resin is an unsaturated-group-containing polycarboxylic resin having an acid value of preferably 40 to 200 mgKOH/g, more preferably 50 to 160 mgKOH/g, and obtained by reacting 100 parts by weight of epoxy acrylate with 5 to 40 parts by weight of a polyfunctional cyanate ester compound to prepare a resin and then reacting the resin with 10 to 90 parts by weight of a polybasic acid anhydride. When the acid value is smaller than the above lower limit, undesirably, the solubility of an obtained photo-setting/thermosetting resin in an alkaline aqueous solution decreases. When the acid value is larger than the above lower limit, undesirably, the electric properties of cured coating of an obtained photo-setting/thermosetting resin decrease. The amount of the unsaturated-group-containing polycarboxylic resin is 20 to 90% by weight, preferably 25 to 70% by weight. When the amount of the unsaturated-group-containing polycarboxylic resin is smaller than the lower limit of the above range, undesirably, the photo-setting/thermosetting type resist is poor in photosensitivity. When it is larger than the above upper limit, undesirably, photo-setting/thermosetting type resist cures insufficiently in some cases.

In the unsaturated-group-containing polycarboxylic resin (e) whose molecule contains a polyfunctional cyanate ester compound, used in the present invention, an epoxy acrylate used as a raw material is a reaction product of an epoxy resin and an acrylic acid. Examples thereof includes a bisphenol A type epoxy acrylate, a bisphenol F type epoxy acrylate, a biphenol-epoxy acrylate, tetramethylbiphenol-epoxy acrylate, hexamethylbiphenol-epoxy acrylate and xylene novolakepoxy acrylate. These may be used alone or in combination.

The polybasic acid anhydride used in the acid modification reaction of component (e) of the present invention can be selected from generally known acid anhydrides having at least two carboxylic anhydrides per molecule. Specifically, it includes phthalic anhydride, trimellitic anhydride, pyromellitic anhydride, naphthalene-1,4,5,8-tetracarboxylic acid dianhydride, benzophenontetracarboxylic anhydride, tetrahydrophthalic anhydride, hexahydrophthalic anhydride, 4-methylhexahydrophthalic anhydride, 3-methylhexahydrophthalic anhydride, succinic anhydride, dodecenylsuccinic anhydride, and other substances having a molecule containing an acid anhydride. These anhydrides are used alone or in combination.

Although the conditions under which epoxy acrylate reacts with a polyfunctional cyanate ester compound are not specially limited, the amount of the polyfunctional cyanate ester compound per 100 parts by weight of the epoxy acrylate is generally 5 to 40 parts by weight, preferably 10 to 30 parts by weight. The reaction temperature is generally 50 to 100° C. and the reaction period of time is generally 5 to 100 hours. A solvent may be used for controlling a viscosity during reaction. Although not specially limited, the solvent specifically includes ketons such as acetone, methyl ethyl ketone and methyl isobutyl ketone; acetates such as dipropylene glycol monomethyl ether acetate, propylene glycol monomethyl ether acetate, dipropylene glycol monoethyl ether acetate and diethylene glycol monomethyl ether acetate; and aromatic hydrocarbons such as solvent naphtha, toluene and xylene. These solvents are used alone or in combination.

Next, the carboxylic acid modification of the above resin is carried out with the polybasic acid anhydride. In this modification, the above reaction product modified by reacting 100 parts by weight of epoxy acrylate with 5 to 40 parts by weight of a polyfunctional cyanate ester compound is reacted with 10 to 90 parts by weight of a polybasic acid anhydride. The thus-obtained resin has an acid value of 40 to 200 mgKOH/g, preferably 50 to 160 mgKOH/g. In this case also, a solvent may be added to control a viscosity. Specifically, the above solvents and esters such as propylene glycol monomethyl ether and dipropylene glycol monomethyl ether are used. The amount of the unsaturated-group-containing polycarboxylic resin (e) based on the photo-setting/thermosetting type resist resin composition is 20 to 90% by weight, preferably 25 to 70% by weight.

Next, the photopolymerizable compound having an ethylenic unsaturated double bond as component (f) used in the photo-setting type resist or the photo-setting/thermosetting type resist of the present invention includes (meth)acrylic acid esters of dihydric or higher alcohols. Examples of the dihydric or higher alcohols include ethylene glycol, 1,2-propanediol, 1,3-propanediol, 1,4-butanediol, 1,5-pentanediol, hexanediol, heptanediol, neopentyl glycol, 1,10-decanediol, cycloheptanediol, 1,4-cyclohexanedimethanol; polyethylene glycols such as diethylene glycol and triethylene glycol; polypropylene glycols such as dipropylene glycol and tripropylene glycol; xylenediol, 2-ethyl-1,3-hexanediol, biphenol, catechol, resorcinol, pyrogallol, glycerine, trimethylol ethane, trimethylol propane, pentaerithritol, dipentaerithritol, tripentaerithritol, sorbitol, glucose, butanetriol, 1,2,6-trihydroxyhexane and 1,2,4-benzenetriol.

Further, there may be used allyl compounds such as polyallyl esters of adipic acid, phthalic acid, terephthalic acid and trimellitic acid, polyallyl esters of polysulfonic acid, diallyl ether and triallylisocyanurate. Further, there maybe used polyvinyl compounds such as divinylbenzene, divinyl sulfone, divinyl phthalate and divinyl terephthalate. In addition, there may be used known compounds and resins. These compounds are used alone or in combination. The amount thereof is 1 to 30% by weight, preferably 2 to 20% by weight.

In order to photoinitiate a polymerization, a photopolymerization initiator (component g) is added to the photo-setting type resist or the photo-setting/thermosetting type resist used in the present invention. Examples of the photopolymerization initiator include α-diketons such as benzyl and acetyl; acyloins such as benzoyl; acyloin ethers such as benzoin methyl ether, benzoin ethyl ether, benzoin isopropyl ether and benzoin isobutyl ether; thioxanthones such as thioxanthone and 1,4-diethylthioxanthone; benzophenones such as benzophenone, 4,4'-bis(dimethylamino) benzophenone; acetophenones such as acetophenone, 1,2'-dimethoxy-2-phenylacetophenone and p-methoxy acetophenone; quinones such as anthraquinone and 1,4-naphthoquinone; and peroxides such as di-t-butylperoxide. These initiators are used alone or in combination. The amount thereof is 0.1 to 20% by weight, preferably 0.2 to 15% by weight.

When the epoxy compound, especially an alicyclic epoxy resin and/or an oxetane resin, is added, it is preferred to add a cationic phtotopolymerization initiator. Examples thereof includes known polymerization initiators such as an aromatic sulfonium salt and a complex of iron, e.g., $\eta^5$-2,4-cyclopentadiene-1-yl)[(1,2,3,4,5,6-$\eta$)-(1-ethylehtyl)bezene]-iron(1+)-hexafluorophosphate(1−). These polymerization initiators are used alone or in combination. The amount of the above polymerization initiator per 100 parts by weight of the epoxy compound is 0.1 to 10 parts by weight, preferably 0.2 to 5 parts by weight.

The thermosetting type resist is applied to a printed wiring board surface by a screen printing or the like and cured by heating alone to form a permanent protective coating. Generally known thermosetting type resists are used. Although not specially limited, the resin to be used includes generally known resins such as an epoxy resin, a polyfunctional cyanate ester resin, a maleimide resin and an unsaturated-group-containing polyphenylene ether resin. These resins are used alone or in combination as required.

The thermosetting type resist composition used in the present invention is cured itself under heat. Since, however, its curing rate is low in some cases, it is poor in workability, economic performances, etc. In such cases, a known heat-curing catalyst may be added into the thermosetting resin. The amount of the catalyst is 0.01 to 5% by weight, preferably 0.015 to 3% by weight. The resist composition in the present invention is used as a homogeneous solventless type by combining respective components or it is used as a solution obtained by dissolving or suspending a resin composition mainly formed of solid components in a solvent.

It is preferable that, before incorporation, the resin composition of the present invention is dissolved in a solvent in which it is soluble. The solvent in which the polyfunctional cyanate ester compound is soluble is not specially limited so long as it can dissolve the above compound. Examples thereof include ketons such as acetone, methyl ethyl ketone and methyl isobutyl ketone; esters such as ethyl acetate, isobutyl acetate, n-butyl acetate, ethylene glycol monoacetate, propylene glycol acetate and dipropylene glycol monoacetate; aromatic hydrocarbons such as toluene and xylene. These solvents are used alone or in combination. Preferably, for inhibiting the viscosity of the solution from increasing because of the evaporation of the solvent, a solvent which has a relatively high boiling point and is hard to evaporate at room temperature is used.

Further, the above solvents may be used to the unsaturated-group-containing polycarboxylic acid resin as component (e). Solvents other than the above solvents may be used and examples thereof include ethylene glycol alkyl ethers; diethylene glycol alkyl ethers; propylene glycol alkyl ethers; and dipropylene glycol alkyl ethers. These solvents are used alone or in combination.

As a method for imparting flame retardancy to these resist compositions, the present invention adopts a specific flame-retardant combination to attain self-extinguishing properties. That is, as flame-retardant components, 100 to 140 parts by weight of (a) aluminum hydroxide, 0.1 to 15 parts by weight of (b) a molybdenum compound and 0.1 to 10 parts by weight of (c) a zinc stannate type compound are incorporated into 100 parts by weight of the resin component, whereby self-extinguishing properties (flame resistance: UL 94 V-0) are attained.

The aluminum hydroxide as component (a) of the present invention may be selected from aluminum hydroxides produced by a known method. The aluminum hydroxide has an average particle diameter of 5 $\mu$m or less, preferably 1 $\mu$m or less. The aluminum hydroxide includes 3 crystallization water. The 3 crystallization water can be used by converting its value to approximately 2 to 2.5 as an average value by heating. When the crystallization water is heated too much and converted into 2 or lower crystallization water, undesirably, the heat-resistant effect decreases.

The molybdenum compound which is another flame-etardant component refers to a compound containing molybdenum. The molybdenum compound may be selected from generally known molybdenum compounds. Specific examples thereof include molybdenum oxide, molybdenum boride, molybdenum silicate, molybdenum sulfide, zinc molybdate, calcium molybdate and ammonium molybdate. These compounds as a powder may be dispersed, as it is, in the resist composition, while preferably the molybdenum compound is supported on an inorganic filler having an average particle diameter of 5 μm or less such as talc, zinc oxide or calcium carbonate before use. As a production method for supporting the molybdenum compound on an inorganic filler carrier, for example, there may be used the method disclosed in U.S. Pat. No. 3,969,127. These molybdenum compounds may be used alone or in combination. 0.1 to 15 parts by weight, preferably 0.5 to 10 parts by weight, of the molybdenum compound together with 100 to 140 parts by weight of the aluminum hydroxide is used per 100 parts by weight of the resin.

The zinc stannate type compound which is further another flame retardant component is added in an amount of 0.1 to 10 parts by weight, thereby increasing the level of flame resistance (V-0). The zinc stannate type compound used in the present invention specifically includes zinc hydroxystannate and zinc stannate. These compounds may be used alone or in combination.

Of course, each of the above flame-retardants can be added in an amount larger than the above amounts. In this case, however, the resist composition itself undesirably becomes fragile or decreases in heat resistance when the resist composition is cured. When each of the above flame-retardants is added in an amount smaller than the above amounts, the flame resistance does not become V-0.

The resist composition of the present invention may contain various additives as desired so long as the inherent properties of the composition are not impaired. Examples of the additives include polyfunctional maleimides, polybutadiene, maleated butadiene, a butadiene-acrylonitrile copolymer, a butadiene-styrene copolymer, acrylic rubber, AS resin, ABS resin, MBS resin, unsaturated-group-containing PPE resin, polyphenylene ether, polysulfone, polyester, polyphenylene sulfide, polystyrene and polyurethane. Further, various known additives such as an organic filler, an inorganic filler, a dye, a pigment, other flame retardant, a thickener, a lubricant, an anti-foamer, a dispersing agent, a leveling agent, a photo-sensitizer and a thixotropic agent may be used alone or in combination as required. A curing agent or a catalyst is incorporated into a compound having a reactive group as required.

The pigment used for coloring is not specially limited. Generally, there may be used a known pigment which preferably has no halogen atom in a molecule. As a blue pigment, it includes copper phthalocyanine blue (C.I. Pigment Blue 15), nickel phthalocyanine blue, nonmetallic phthalocyanine blue (C.I. Pigment Blue 16), iron phthalocyanine blue, alkali blue (C.I. Pigment Blue 1, 2, 3, 10, 14, 18, 19, 24, 56, 57, 61), prussian blue (C.I. PigmentBlue 27), ultramarine (C.I. Pigment Blue 29), cobalt blue (C.I. Pigment Blue 28), sky blue (C.I. Pigment Blue 35) and cobalt phthalocyanine (C.I. Pigment Blue 75). These pigments have no halogen atom such as chlorine in a molecule. As an yellow pigment, there is preferably used enzimidron yellow (C.I. Pigment Yellow 120, 151, 175, 180, 181, 194), anthraquinone yellow (C.I. Pigment Yellow 123, 147), isoindolin yellow (C.I. Pigment Yellow 139, 185) and metal complex (C.I. Pigment Yellow 150, 153, 177, 179) each of which has no halogen atom in a molecule. Pigments having colors other than the above colors can be used. However, for preparing the intended halogen free resist composition of the present invention, a pigment whose molecule has no halogen atom is used rather than a conventional green pigment containing a halogen atom in a molecule. The above pigments whose molecule has no halogen atom may be used in combination.

The resist composition of the present invention can be applied to a printed wiring board by a generally known method such as a screen printing method, a roll coater method or a curtain coater method. The resist compositions of the present invention are cured by an optimal curing pattern for each of a thermosetting type, a UV-and-heat-combination type (photo-setting/thermosetting type) and a UV-setting type. For example, the thermosetting type resist is applied to a printed wiring board surface by screen printing, etc., a solvent is removed from the applied thermosetting type resist by drying under heat as required, and then the thermosetting resin is cured by heating. As for the photo-setting/thermosetting type resist, the photo-setting/thermosetting type resist is applied to a material to be covered, such as a printed wiring board, the applied photo-setting/thermosetting type resist is pre-dried to remove a solvent, necessary portions of the pre-dried photo-setting/thermosetting type resist are selectively photically cured by irradiation of an active energy ray such as ultraviolet ray, not-cured portions are developed and removed with a dilute alkaline aqueous solution, etc., and then a post-curing is carried out by heating. Thereafter, nickel plating and gold plating are carried out by electroless plating or electrolytic plating as required, to obtain a printed wiring board for mounting a semiconductor chip. As for the photo-setting type resist, the photo-setting type resist is applied to a material to be covered, the applied photo-setting type resist is dried to remove a solvent as required, and then the photo-setting type resist is cured by light.

After the application, a solvent is removed by pre-drying under heat as required. A generally known device such as a hot-air drying furnace may be used for the drying. In the case of the photo-setting/thermosetting type resist, for example, the drying temperature is 30 to 100° C. preferably 50 to 80° C. When the drying temperature is low, too long drying time is required and working efficiency is therefore poor. When the drying temperature is high, resin members are reacted with each other and therefore it becomes difficult to dissolve the resist with a developer. The drying time is 10 minutes to 2 hours, preferably 15 to 60 minutes.

The printed wiring board used in the present invention can be used by only polishing a patterned copper conductor surface before the application of the photo-setting/thermosetting type resist. However, it is preferred to roughen the copper surface and then treat the printed wiring board by a rustproofing treatment containing a copper chelate agent in advance. The rustproofing treatment improves adhesion between the copper conductor and the resin, which provides great improvements such as a decrease of an insulating-property deterioration after a pressure-cooker treatment or no occurrence of peelings.

The rustproofing agent may be selected from generally known rustproofing agents. Further, the copper chelate agent may be selected from generally known copper chelate agents. Examples of these include polybenzimidazole and chromate treatment. These agents are used alone or in combination. For example, there is preferably used a rustproofing solution, CL8300E, supplied by Meck K.K.

A coating of the photo-setting/thermosetting resin, applied on a printed wiring board, is covered with a film and exposed to irradiation of parallel light through the film, when the photo-setting/thermosetting resin is solventless. When it is a solvent type resin, the coating of the photo-setting/thermosetting resin is covered with a film after removing the solvent and then exposed to an active energy ray to photically cure necessary portions. Portions which are not exposed to light are dissolved and removed with a developer, then the photo-setting/thermosetting resin is post-cured by heating and nickel plating and gold plating are carried out to complete a printed wiring board.

As an irradiation light source of an active energy ray for curing the photo-setting type resist and the photo-setting/thermosetting type resist by light, there is used a low-pressure mercury lamp, a middle pressure mercury lamp, a high pressure mercury lamp, an ultrahigh pressure mercury lamp, a xenon lamp or a metal halide lamp. Although the luminous exposure is not specially limited, it is generally 100 to 3,000 mJ/cm$^2$, preferably 300 to 2,000 mJ/cm$^2$. In addition to the above light sources, an electron ray and a laser can be used.

A coating of the photo-setting/thermosetting type resist is developed by a generally known method such as a spray developing method or a dip developing method in which a printed wiring board is dipped and shaken in a developer. The temperature of the developer is 5 to 50° C. preferably 25 to 40° C. When the temperature is low, the problem is that too long developing time is taken or that developing properties are poor. When the temperature is high, the cured portions which have been exposed to light are dissolved. The developer includes generally known dilute alkaline aqueous solution such as an aqueous solution of sodium carbonate, sodium hydroxide or ammonium hydroxide. Further, there may be also used an aqueous solution obtained by adding an water-soluble organic solvent into water and an aqueous solution obtained by adding an water-soluble organic solvent and an alkali agent into water. The amount of the alkali agent in the aqueous solution is preferably 0.1 to 5% by weight.

The water-soluble organic solvent includes generally known organic solvents such as ethylene glycol monomethyl ether, diethylene glycol monomethyl ether, diethylene glycol monoethyl ether, propylene glycol monomethyl ether, dipropylene glycol monomethyl ether, methyl lactate, ethyl lactate, butyl lactate, diethylene glycol, methanol, ethanol, propanol, γ-butyrolactone and methyl cellosolve. The water-soluble organic solvent is used in an amount of 10 to 80% by weight, preferably 15 to 50% by weight, based on the entire aqueous solution. Further, an alkali agent such as sodium hydroxide, sodium silicate or monomethanol amine may be added for increasing developing properties.

The photo-setting/thermosetting type resist is cured by heating after developing. Further, the thermosetting type resist is applied by a screen printing and the applied thermosetting type resist is pre-cured to remove the solvent and then cured by heating. The curing temperature is 100 to 250° C., preferably 120 to 180° C. Thereafter, nickel plating and gold plating are carried out.

According to the present invention, there is provided a flame retardant-containing resist composition capable of providing a halogen-free, phosphorus-free and antimony-free coating which is excellent in safety and which itself has self-extinguishing properties (UL94 V-0). According to the present invention, further, there is provided a flame retardant-containing resist composition whose coating, obtained by applying the resist composition to a halogen-free printed wiring board and drying it, has self-extinguishing properties (V-0) as a whole. When a resist composition which itself does not have self-extinguishing properties (UL94 HB) or a resist composition which itself has a slight self-extinguishing properties (UL94 V-1) is applied to the surface of a halogen-free printed wiring board (UL94 V-0), dried and then cured, the resultant printed wiring board can not attain UL94 V-0 as a whole and has a flame resistance problem. As for a halogen-free resist using only a color pigment containing no halogen atom in a molecule, this resist itself does not show self-extinguishing properties. When the above resist is applied to a halogen-free printed wiring board and the applied resist is cured, the thus-obtained printed wiring board merely shows HB. In contrast, the flame retardant resist composition of the present invention shows excellent self-extinguishing properties (UL 94V-0) so that it is apparent that the flame retardant resist composition of the present invention is very effective for electronic devices requiring flame resistance. Further, the flame retardant resist composition of the present invention has a molecule containing a polyfunctional cyanate ester compound so that there can be obtained a preferable permanent protective coating for a printed wiring board which permanent protective coating is excellent in heat resistance and anti-migration properties required for the reliability of a printed wiring board that is becoming denser and denser.

EXAMPLES

The present invention will be explained more in detail with reference to Examples and Comparative Examples hereinafter, in which "part" stands for "part by weight" unless otherwise specified.

<Synthesis of a Polyfunctional Cyanate Ester Prepolymer>

Synthetic Example 1

1,000 parts of 2,2-bis(4-cyanatophenyl)propane was melted at 150° C. and allowed to react for 4 hours with stirring, to prepare a prepolymer (X-1) having a weight average molecular weight of 1,900 and a melting point of 66° C. The prepolymer (X-1) was dissolved methyl ethyl ketone to prepare a solution.

<Synthesis of Component (e): Unsaturated-group-containing Polycarboxylic Acid Resin>

Synthetic Example 2

A flask was equiped with a thermometer, a stirrer, a circulating cooler, a dropping funnel and a nitrogen-introducing tube. 1,000 parts of dipropylene glycol monomethyl ether was placed in the flask and heated up to 100° C. A mixture containing 14 parts of benzoyl peroxide, 420 parts of methyl methacrylate, 70 parts of hydroxyethyl methacrylate and 210 parts of methacrylic acid was dropwise added thereto over 2 hours and maintained for 8 hours. The thus-obtained acrylate resin had an acid value of 200 mgKOH/g. Then, 210 parts of glycidyl methacrylate, 3.5 parts of triethylamine and 0.07 part of hydroquinone were added to the above resin and the mixture was allowed to react for 5 hours at 100° C. to obtain a solution of an unsaturated-group-containing polycarboxylic acid resin (solid component was considered as E-1) having a methacryloyl group of 1.7 mol/kg and an acid value of 89 mgKOH/g.

Synthetic Example 3

1,000 parts of bisphenol A type epoxy acrylate (trade name: SP1509, supplied by Showa Highpolymer Co., Ltd.), 50 parts of the polyfunctional cyanate ester prepolymer component obtained in Synthetic Example 1 and 1,050 parts of dipropylene glycol monomethyl ether acetate/solvent naphtha (weight ratio of 50/50) as a solvent were mixed to attain a solid component of 50% by weight. Then, the mixture was allowed to react under heat at 70° C. with stirring, and a change at the peak (around 2,300 cm$^{-1}$) of cyanato group was traced according to an infrared absorption spectrum. After 5.5 hours, the peak of cyanato group disappeared. The reaction was terminated at this moment. 218 parts of pyromellitic anhydride and 218 parts of the above mixed solvents were added to the reaction mixture. The mixture was allowed to react at 70° C. with stirring, and a change at the peak (around 1,850 cm$^{-1}$) of carboxylic anhydride was traced according to an infrared absorption spectrum. After 6 hours, the peak of carboxylic anhydride disappeared. The reaction was terminated at this moment. The thus-obtained resin (solid component was considered as E-2) had an acid value of 90 mgKOH/g.

Synthetic Example 4

A resin (solid component was considered as E-3) was prepared in the same manner as in Synthetic Example 3 except that the amount of the polyfunctional cyanate ester prepolymer component was changed from 50 parts to 300 parts and that 218 parts of the pyromellitic anhydride was replaced with 521 parts of tetrahydrophthalic anhydride. The resin had an acid value of 100 mgKOH/g.

Synthetic Example 5

A resin (solid component was considered as E-4) was prepared in the same manner as in Synthetic Example 3 except that the amount of the polyfunctional cyanate ester prepolymer component was changed from 50 parts to 100 parts and that 218 parts of the pyromellitic anhydride was replaced with 174 parts of pyromellitic anhydride. The resin had an acid value of 75 mgKOH/g.

Examples 1 to 3, Comparative Examples 1 to 5

<Flame Retardant>

Aluminum hydroxide trihydrate (A-1, average particle diameter 2 $\mu$m) as component a, a powder (trade name: KEMGARD911C, supplied by Sharwin-Williams, component B-1 as a powder) having a zinc molybdate content of 19% by weight wherein zinc molybdate was supported on talc (average particle diameter 4.1 $\mu$m) as component b, zinc hydroxystannate (trade name: ZHS, supplied by JOSEPH STOREY & CO., LTD, component C-1) as component c were used.

<Epoxy Resin>

As component d, a modified xylene resin epoxidation product (trade name: DENACALT T, supplied by Nagase Kasei Kogyo K.K., component D-1), an alicyclic epoxy resin (trade name: CELLOXIDE 2021, supplied by Daicel Chemical Industries, LTD, component D-2) and an alicyclic epoxy resin (trade name: EHPE3150, supplied by Daicel Chemical Industries, LTD, component D-3) were used.

<Ethylenic Unsaturated Monomer>

As component f, tetraethylene glycol diacrylate (component F-1) and trimethylol propane triacrylate (component F-2) were used.

<Photopolymerization Initiator>

As component g, a photopolymerization initiator (trade name: IRUGACURE 907, supplied by Ciba Specialty Chemicals, component G-1) was used.

<Pigment>

A blue pigment (trade name: copper phthalocyanine blue KRO, C.I. Pigment Blue 15:3, supplied by Sanyo Color Works, LTD, component H-1), a yellow pigment (C.I. Pigment Yellow 151, component H-2) and a green pigment (C.I. Pigment Green 7, component H-3) were used. Each of the blue pigment and the yellow pigment had no halogen (chlorine) in a molecule.

<Additive>

A leveling agent (trade name: BYK055, supplied by BYK Cheme Japan, Component I-1), an anti-foamer (trade name: Flowlen AC300, supplied by Kyoeisha Chemical Co., LTD, component I-2) and a coupling agent (trade name: A-187, supplied by Nihon Yunica K.K., component I-3) were used.

The above components were mixed in amounts shown in Table 1. The mixture was kneaded with a three-roll to obtain a viscous coating composition. The coating composition was applied to a printed wiring board of which a copper circuit surface had been treated by Meck treatments (CZ8100 treatment + CL8300E treatment, supplied by Meck K.K.) and had a surface-roughness of 2 $\mu$m, and dried at 80° C. for 20 minutes to remove a solvent, a negative film was disposed on the resultant printed wiring board surface, the printed wiring board surface was irradiated with ultraviolet ray at 1,000 mJ/cm$^2$, then the coating composition was developed with a 1 wt % sodium carbonate aqueous solution and then the coating was dried by heating at 150° C. for 1 hour. Table 2 shows estimation results of properties.

Further, for estimating flame resistance (UL 94), the above coating composition was applied to each surface of a 0.2 mm thick laminate obtained by etching and removing copper foils of a halogen-free, phosphorus-free and antimony-free copper-clad laminate (trade name: CCL-HL832NB, supplied by Mitsubishi Gas Chemical Company, INC., flame resistance UL94 V-0) and the applied coating composition was dried to obtain a test piece having a resist thickness of 40 $\mu$m and a size of 12.7×127 mm. The test piece was subjected to a UL 94 flame resistance test. Table 2 shows the results.

The above coating composition was applied to a substrate surface having 50 comb-like patterns formed (trade is, name of copper-clad laminate used: CCL-HL830, supplied by Mitsubishi Gas Chemical Company, INC., line/space =60/60 $\mu$m) by a screen printing method and the coating composition was dried with a hot air dryer at 80° C., to obtain a coating having a thickness of 30 to 40 $\mu$m. Then, a negative film was placed on the coating such that the negative film was brought into intimate contact with the coating, the coating was irradiated with ultraviolet ray at 1,000 mJ/cm$^2$ through the negative film, then the coating was developed with a 1 wt % sodium carbonate aqueous solution and the coating was further cured by heating at 150° C. for 1 hour. The thus-obtained test piece was measured for anti-migration properties at 85° C. at 85% RH under 50 VDC. Table 2 shows the results.

The coating formed from the resin composition was estimated for properties by the following methods.

Pencil hardness: Estimated according to JIS K 5400.

Adhesion: According to JIS K5400, 100 grids having a size of 1 mm×1 mm each were formed on a test piece, a peeling test was carried out with a cellophane tape and the peeling state of the grids was observed. In Table, the denominator is the number of tested grids and the numerator is the number of remaining grids.

Heat resistance against soldering: The printed wiring board was immersed in a soldering bath having a temperature of 260° C. for 30 seconds and then the resist was visually observed for failures.

Glass transition temperature: a coating having a thickness of 40 $\mu$m was formed and the coating was measured for a glass transition temperature according to the TMA method (JIS C6481).

Developing properties and acid resistance: After development, the coating was thermally cured at 150° C. for 1 hour, the developed surface was visually observed. In conjunction with the above observation, electroless nickel plating (pH 4.5, immersion 90° C. 20 minutes) was carried out and the adherent state of the nickel plating was observed, to determine developing properties. After the coating was dried at 120 C. for 1 hour to remove a water content, the resist surface was observed for the state affected by a chemical agent.

Thermal expansion coefficient: Measured according the TMA (JIS C6481). $\alpha_1$: a thermal expansion coefficient at a glass transition temperature or lower, $\alpha_2$: a thermal expansion coefficient at a glass transition temperature or higher.

Anti-migration properties: Measured at 85° C. at 85%RH under 50 VDC.

Flame resistance: Measured according to UL94.

(Flame resistance-1): Copper foils of a halogen-free, phosphorus-free and antimony-free copper-clad laminate (trade name: CCL-HL832NB 0.2 mm, UL94 V-0) as an internal board were removed by etching, a resist composition was applied to each surface of the resultant laminate such that a coating had a thickness shown in each of Examples and Comparative Examples, the applied resist composition was UV-cured and thermally-cured and the thus-obtained laminate was measured for flame resistance according to the measurement method of UL94.

(Flame resistance-2): A resist composition was applied and the resist composition was again applied thereon. And the applied resist composition was cured to obtain a coating having a thickness of 200 to 300 μm. The coating alone was measured for flame resistance according to the measurement method of UL94.

Analysis of impurities: all chlorines, all bromines: Analyzed or measured according to the halogen-amount measurement method of the halogen-free copper-clad laminate standard (JPCA-ES01-1999) established by Japan Printed Circuit Association (JPCA). In this standard, the term "halogen-free" is defined as a state in which the content of each of chlorine and bromine is respectively 0.09% or lower.

Phosphorus, antimony: Measured according to the ICP method (inductive coupling plasma method).

TABLE 1

[0081]

| Component | Examples | | | Comparative Examples | | | | |
|---|---|---|---|---|---|---|---|---|
| | 1 | 2 | 3 | 1 | 2 | 3 | 4 | 5 |
| (a) A-1 | 110 | 120 | 135 | 110 | 0 | 135 | 135 | 0 |
| (b) B-1 | 50 | 17 | 5 | 50 | 100 | 0 | 0 | 0 |
| Mo compound | (9.5) | (3.23) | (0.95) | (9.5) | (19.0) | (0) | (0) | (0) |
| (c) C-1 | 8 | 4 | 2 | 0 | 0 | 8 | 0 | 0 |
| (d) D-1 | 4 | 0 | 15 | 4 | 4 | 15 | 2 | 15 |
| D-2 | 0 | 6 | 2 | 0 | 0 | 2 | 0 | 2 |
| D-3 | 6 | 13 | 13 | 6 | 6 | 13 | 10 | 13 |
| (e) E-1 | 70 | 0 | 0 | 70 | 70 | 0 | 0 | 0 |
| E-2 | 0 | 53 | 0 | 0 | 0 | 0 | 0 | 0 |
| E-3 | 0 | 0 | 48 | 0 | 0 | 48 | 0 | 48 |
| E-4 | 0 | 0 | 0 | 0 | 0 | 0 | 65 | 0 |
| (f) F-1 | 7 | 5 | 7 | 7 | 7 | 7 | 0 | 0 |
| F-2 | 0 | 8 | 0 | 0 | 0 | 0 | 8 | 0 |
| (g) G-1 | 10 | 12 | 12 | 10 | 10 | 12 | 12 | 12 |
| (h) H-1 | 0.5 | 0.5 | 0.3 | 0.5 | 0 | 0.3 | 0.5 | 0 |
| H-2 | 0 | 0 | 0.2 | 0 | 0 | 0.2 | 0 | 0 |
| H-3 | 0 | 0 | 0 | 0 | 0.5 | 0 | 0 | 0.5 |
| (i) I-1 | 0.5 | 0.5 | 0.5 | 0.5 | 0.5 | 0.5 | 0.5 | 0.5 |
| I-2 | 0.5 | 0.5 | 0.5 | 0.5 | 0.5 | 0.5 | 0.5 | 0.5 |
| I-3 | 1.5 | 1.5 | 1.5 | 1.5 | 1.5 | 1.5 | 1.5 | 1.5 |

TABLE 2

[0082]

| Item | Examples | | | Comparative Examples | | | | |
|---|---|---|---|---|---|---|---|---|
| | 1 | 2 | 3 | 1 | 2 | 3 | 4 | 5 |
| Color tone | Blue | Blue | Green | Blue | Green | Green | blue | Green |
| Pencil hardness | 4H | 4H | 4H | 4H | 4H | 4H | 4H | 4H |
| Adhesion (Y/100) | 100/ | 100/ | 100/ | 100/ | 97/ | 100/ | 100/ | 100/ |
| Heat resistance against soldering | Good | Good | Good | Good | Swelling | Good | Good | Good |
| Glass transition temperature (° C.) | 95 | 135 | 137 | 94 | 95 | — | — | — |
| Developing properties | Good | Good | Good | Good | Good | Good | Good | Good |

TABLE 2-continued

[0082]

| Item | Examples | | | Comparative Examples | | | | |
|---|---|---|---|---|---|---|---|---|
| | 1 | 2 | 3 | 1 | 2 | 3 | 4 | 5 |
| Acid resistance | Good | Good | Good | Good | Whitened | Good | Good | Good |
| Thermal expansion coefficient | | | | | | | | |
| $\alpha_1$ | 51 | 53 | 52 | 53 | 65 | 52 | 55 | 87 |
| $\alpha_2$ | 80 | 89 | 81 | 92 | 123 | 80 | 90 | 170 |
| Deterioration of an insulating resistance value in anti-migration properties ($\Omega$, 85° C., 85 % RH, 50 VDC treatment) | | | | | | | | |
| Ordinary state | $3 \times 10^{14}$ | $4 \times 10^{14}$ | $4 \times 10^{14}$ | $2 \times 10^{14}$ | — | — | $1 \times 10^{14}$ | $5 \times 10^{14}$ |
| 500 hrs. | $9 \times 10^{8}$ | $4 \times 10^{10}$ | $2 \times 10^{10}$ | $8 \times 10^{8}$ | — | — | $2 \times 10^{10}$ | $3 \times 10^{10}$ |
| Impurities (ppm) | | | | | | | | |
| All Chlorines | 470 | 410 | 348 | 468 | 1,270 | 349 | 379 | 2,705 |
| All Bromines | <5 | <5 | <5 | <5 | <5 | <5 | <5 | <5 |
| phosphorus | <50 | <50 | <50 | <50 | <50 | <50 | <50 | <50 |
| Antimony | <5 | <5 | <5 | <5 | <5 | <5 | <5 | <5 |
| Flame resistance-1 | V-0 | V-0 | V-0 | V-1 | HB | HB | HB | HB |
| Flame resistance-2 | V-0 | V-0 | V-0 | V-1 | HB | HB | HB | HB |

Examples 4 and 5, Comparative Examples 6 to 8

The polyfunctional cyanate ester prepolymer (component X-1) prepared in Synthesis Example 1, the epoxy resins used in Examples 1 to 3, a solution of iron acetylacetonate (component J-1) in MEK and a solution of 2-ethylimidazole (component J-2) in MEK as catalysts, and a solution of dicyandiamide (component Y-1) in dimethylformamide were incorporated in amounts shown in Table 3, to obtain thermosetting resin composition varnishes. An additive and a flame retardant were added to the thermosetting resin composition varnishes, to obtain thermosetting type resist compositions. Similarly to Examples 1 to 3, the thermosetting type resist composition was applied to each surface of a board having patterns formed and each surface of a laminate of which copper foil had been removed by etching such that each of the board and the laminate had a coating having a thickness of 30 to 40 μm, and the coating of the board and the coating of the laminate were cured by heating at 150° C. for 90 minutes. Table 4 shows properties thereof.

TABLE 3

[0084]

| Component | Examples | | Comparative Examples | | |
|---|---|---|---|---|---|
| | 4 | 5 | 6 | 7 | 8 |
| (a) A-1 | 110 | 135 | 110 | 135 | 0 |
| (b) B-1 | 50 | 6 | 50 | 0 | 0 |
| Mo compound | (9.5) | (1.14) | (9.5) | (0) | (0) |
| (c) C-1 | 6 | 3 | 0 | 9 | 0 |
| (d) D-1 | 20 | 10 | 20 | 10 | 10 |
| D-2 | 20 | 22 | 20 | 22 | 22 |
| D-3 | 17 | 0 | 17 | 65 | 0 |
| (h) H-1 | 0.5 | 0.3 | 0.3 | 0.3 | 0 |
| H-2 | 0 | 0.2 | 0 | 0.2 | 0 |
| H-3 | 0 | 0 | 0 | 0 | 0.5 |
| (i) I-1 | 0.5 | 0.5 | 0.5 | 0.5 | 0.5 |
| I-2 | 0.5 | 0.5 | 0.5 | 0.5 | 0.5 |
| (j) J-1 | 0.2 | 0.4 | 0.2 | 0 | 0.4 |

TABLE 3-continued

[0084]

| Component | Examples | | Comparative Examples | | |
|---|---|---|---|---|---|
| | 4 | 5 | 6 | 7 | 8 |
| J-2 | 0 | 0 | 0 | 0.3 | 0 |
| (x) X-1 | 40 | 65 | 40 | 0 | 65 |
| (y) Y-1 | 0 | 0 | 0 | 5 | 0 |

TABLE 4

[0085]

| Item | Examples | | Comparative Examples | | |
|---|---|---|---|---|---|
| | 4 | 5 | 6 | 7 | 8 |
| Color tone | Bluish green | Green | Bluish green | Green | Green |
| Pencil hardness | 5H | 5H | 5H | 5H | 5H |
| Adhesion (Y/100) | 100/ | 100/ | 100/ | 100/ | 100/ |
| Heat resistance against soldering | No failure | No failure | No failure | No failure | No failure |
| Glass transition temperature (° C.) | 192 | 219 | 193 | 152 | 219 |
| Deterioration of an insulating resistance value in anti-migration properties ($\Omega$, 85° C./85 % RH, 50 VDC) | | | | | |
| Ordinary state | $5 \times 10^{14}$ | $3 \times 10^{14}$ | $5 \times 10^{14}$ | $4 \times 10^{14}$ | $3 \times 10^{14}$ |
| 1,000 hrs. | $3 \times 10^{10}$ | $2 \times 10^{10}$ | $3 \times 10^{10}$ | $<10^{8}$ | $4 \times 10^{10}$ |
| Impurities (ppm) | | | | | |
| All Chlorines | 510 | 411 | 506 | 398 | 2,900 |
| All Bromines | <5 | <5 | <5 | <5 | <5 |
| phosphorus | <5 | <5 | <5 | <5 | <5 |
| Antimony | <5 | <5 | <5 | <5 | <5 |
| Flame resistance-1 | V-0 | V-0 | V-1 | HB | HB |

TABLE 4-continued

[0085]

| | Examples | | Comparative Examples | | |
|---|---|---|---|---|---|
| Item | 4 | 5 | 6 | 7 | 8 |
| Flame resistance-2 | V-0 | V-0 | V-1 | HB | HB |

<Measurement Methods>

Measurements were carried out in the same manner as in Examples 1 to 3 except that, in the preparation of the test piece for anti-migration properties, the curing time after the application of the resist composition was changed from 1 hour at 150° C. to 90 minutes at 150° C.

Example 6, Comparative Examples 9 and 10

The epoxy resins (component D-2, D-3), the ethylenic unsaturated monomer (component F-2) and the photopolymerization initiator (component G-1) which were used in the previous Examples and Comparative Examples, a cationic polymerization initiator (trade name: IRGACURE261, supplied by Ciba Specialty Chemicals, component K-1) and cumene hydroperoxide (component L-1) as a polymerization assistant were incorporated in amounts shown in Table 5, to obtain photo-setting resin varnishes. An additive and a flame retardant were added to the photo-setting resin varnishes to obtain photo-setting type resist compositions. Similarly to Examples 1 to 3, the photo-setting type resist composition was applied to each surface of a laminate of which copper foil had been removed by etching such that the laminate had a coating having a thickness of 30 to 40 μm, and the coating of the laminate was dried and then photically cured by UV irradiation at 1,000 mJ/cm². Table 6 shows properties thereof.

TABLE 5

| | Example | Comparative Examples | |
|---|---|---|---|
| Component | 6 | 9 | 10 |
| (a) A-1 | 135 | 135 | 0 |
| (b) B-1 | 20 | 20 | 0 |
| Mo compound | (3.8) | (3.8) | (0) |
| (c) C-1 | 5 | 0 | 0 |
| (d) D-2 | 40 | 40 | 40 |
| D-3 | 20 | 20 | 20 |
| (f) F-2 | 30 | 30 | 30 |
| (g) G-1 | 5 | 5 | 5 |
| (h) H-1 | 0.5 | 0.5 | 0 |
| H-2 | 0 | 0 | 0.5 |
| (k) K-1 | 2 | 2 | 2 |
| (l) L-1 | 2.5 | 2.5 | 2.5 |

TABLE 6

| | Example | Comparative Examples | |
|---|---|---|---|
| Item | 6 | 9 | 10 |
| Color tone | Blue | Blue | Green |
| Impurities (ppm) | | | |
| All Chlorines | 359 | 358 | 2,780 |
| All Bromines | <5 | <5 | <5 |
| phosphorus | <5 | <5 | <5 |
| Antimony | <5 | <5 | <5 |

TABLE 6-continued

| | Example | Comparative Examples | |
|---|---|---|---|
| Item | 6 | 9 | 10 |
| Flame resistance-1 | V-0 | V-1 | HB |
| Flame resistance-2 | V-0 | V-1 | HB |

The above results indicate the following. When a resist composition contains the flame retardant of the present invention, the resist composition has a halogen content of 0.09% or lower which is a value defined by JPCA standard, and remarkably low phosphorus and antimony contents (lower than the limit of detection) and can attain self-extinguishing properties (flame resistance). The resist composition containing the flame retardant of the present invention exhibits self-extinguishing properties (UL94 V-0) by itself. A printed wiring board obtained by applying the above resist composition to a printed wiring board surface and curing the applied resist composition also shows self-extinguishing properties (V-0) and the above printed wiring board is excellent in flame resistance and is therefore useful. The resist composition containing the flame retardant of the present invention and further containing a polyfunctional cyanate ester compound or the resist composition containing the flame retardant of the present invention and further having a polyfunctional cyanate ester compound incorporated into a molecule by reaction, is excellent in insulation resistance such as anti-migration properties or excellent in heat resistance, Tg, etc., and the resist composition maintains its properties.

What is claimed is:

1. A resist composition for permanent protective coating of a printed wiring board, which resist composition is excellent in flame resistance and is obtained by incorporating as essential components a flame retardant containing 100 to 140 parts by weight of (a) aluminum hydroxide, 0.1 to 15 parts by weight of (b) a molybdenum compound and 0.1 to 10 parts by weight of (c) a zinc stannate or zinc hydroxystannate into 100 parts by weight of a resin.

2. A resist composition according to claim 1, wherein the resin is at least one selected from the group consisting of a thermosetting resin, a photo-setting/thermosetting resin and a photo-setting resin.

3. A resist composition according to claim 1, wherein the resin contains a polyfunctional cyanate ester compound or the resin contains a resin having a molecule containing a polyfunctional cyanate ester compound.

4. A resist composition according to claim 2, wherein the photo-setting/thermosetting resin is a resin containing 5 to 35% by weight of (d) an epoxy resin, 20 to 90% by weight of (e) an unsaturated-group-containing polycarboxylic acid resin, 1 to 30% by weight of (f) ethylenic unsaturated monomer and 0.1 to 20% by weight of (g) a photopolymerization initiator as essential components.

5. A resist composition according to claim 4, wherein the unsaturated-group-containing polycarboxylic acid resin is a resin having a molecule containing a polyfunctional cyanate ester compound.

6. A resist composition according to claim 5, wherein the polyfunctional cyanate ester compound is a monomer of said cyanate ester compound and a prepolymer of said cyanate ester compound which prepolymer has a molecular weight of 400 to 6,000.

7. A resist composition according to claim 4, wherein the unsaturated-group-containing polycarboxylic acid resin is a resin having an acid value of 40 to 200 mgKOH/g and obtained by reacting a reaction product of 100 parts by weight of epoxy acrylate and 5 to 40 parts by weight of a polyfunctional cyanate ester compound, with 10 to 90 parts by weight of a polybasic acid anhydride.

8. A resist composition according to claim 1, wherein the aluminum hydroxide has an average particle diameter of 5 μm or lower.

* * * * *